United States Patent
Chu et al.

(10) Patent No.: US 7,961,481 B2
(45) Date of Patent: Jun. 14, 2011

(54) PULSE WIDTH MODULATION CONTROL CIRCUIT APPLIED TO CHARGE OUTPUT CAPACITOR

(75) Inventors: Yi-Shan Chu, Hsin-Chu (TW); Yu-Bin Wang, Hsin-Chu (TW); Hsing-Kuo Chao, Hsin-Chu (TW)

(73) Assignee: Leadtrend Technology Corp., Science-Based Industrial Park, Hsin-Chu (TW)

( * ) Notice: Subject to any disclaimer, the term of this patent is extended or adjusted under 35 U.S.C. 154(b) by 480 days.

(21) Appl. No.: 11/942,720

(22) Filed: Nov. 20, 2007

(65) Prior Publication Data

US 2009/0128209 A1    May 21, 2009

(51) Int. Cl.
*H02M 3/335* (2006.01)
(52) U.S. Cl. .......................................................... 363/20
(58) Field of Classification Search .................. 323/271, 323/285, 287, 288, 282; 363/20; 361/94
See application file for complete search history.

(56) References Cited

U.S. PATENT DOCUMENTS

| | | | | |
|---|---|---|---|---|
| 4,618,812 A * | 10/1986 | Kawakami | ................... | 323/224 |
| 5,367,248 A * | 11/1994 | Lin | ................... | 323/312 |
| 6,344,983 B1 * | 2/2002 | Glennon | ................... | 363/21.12 |
| 6,828,834 B2 * | 12/2004 | Sivero et al. | ................... | 327/143 |
| 6,853,563 B1 * | 2/2005 | Yang et al. | ................... | 363/21.15 |
| 7,026,851 B2 * | 4/2006 | Yang et al. | ................... | 327/172 |
| 7,054,170 B2 * | 5/2006 | Yang et al. | ................... | 363/21.18 |
| 7,196,947 B2 * | 3/2007 | Seitz | ................... | 365/189.11 |
| 7,207,054 B1 * | 4/2007 | Richards et al. | ................... | 725/72 |
| 7,379,284 B2 * | 5/2008 | Fukushi et al. | ................... | 361/94 |
| 7,482,791 B2 * | 1/2009 | Stoichita et al. | ................... | 323/271 |
| 7,577,002 B2 * | 8/2009 | Yang | ................... | 363/1 |

* cited by examiner

*Primary Examiner* — Adolf Berhane
*Assistant Examiner* — Yemane Mehari
(74) *Attorney, Agent, or Firm* — Winston Hsu; Scott Margo (57) ABSTRACT

A pulse width modulation (PWM) control circuit is applied to a power converter with a charging capacitor. The PWM control circuit includes a PWM signal generator, a first comparator, and a reference voltage modulator. A PWM signal generator generates a PWM signal to control a power switch in the power converter. Two input terminals of the first comparator respectively receive a first reference voltage and a sensing voltage, which is proportional to a primary-side current of a transformer. When the power switch is turned on and the sensing voltage rises to the level of the first reference voltage, the first comparator outputs a first control signal to the PWM signal generator. Then, the PWM signal generator outputs a signal to turn off the power switch. The reference voltage modulator outputs the first reference voltage according to a feedback voltage relative to the output voltage of the power converter.

9 Claims, 6 Drawing Sheets

PULSE WIDTH MODULATION CONTROL CIRCUIT APPLIED TO CHARGE OUTPUT CAPACITOR

BACKGROUND OF THE INVENTION

1. Field of the Invention

The present invention relates to a pulse width modulation control circuit, and more particularly, to a pulse width modulation control circuit applied to charge an output capacitor of a power converter.

2. Description of the Prior Art

In the field of digital cameras, there is sometimes inadequate light for taking pictures. In order to obtain better photographic quality, a flashlight for providing additional light is needed. The working voltage of the lamp in the flashlight, however, is much greater than the camera's internal battery voltage. For example, the working voltage of a flashlight lamp is about 300V, whereas the working voltage of Lithium battery is about 3V-4.2V, and the working voltage of two AA batteries is about 2V-3V. At this time, high-voltage charging circuits are installed inside the cameras, which use a flyback topology and a transformer with large ratio of windings (due to the thinness of the cameras, the ratio of windings is about 10) to charge a high-voltage capacitor in order to attain a higher voltage (up to 300V in general). When the high-voltage capacitor attains the working voltage of the flashlight, it provides the required energy for the flash of the flashlight.

Figure 1:
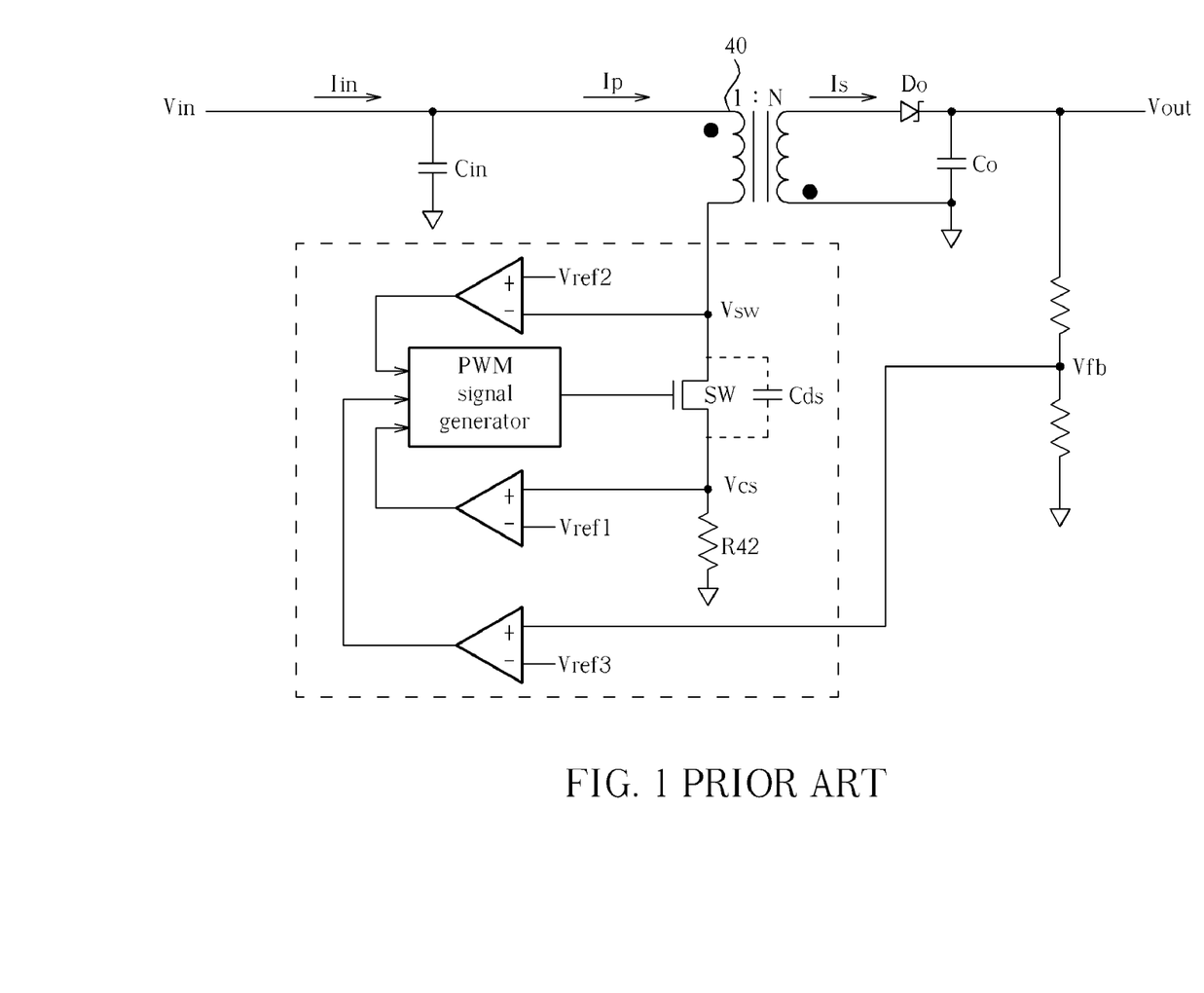
FIG. 1 is a diagram of a charging circuit with flyback topology according to the prior art.

Please refer to FIG. 1. FIG. 1 is a diagram of a charging circuit with flyback topology according to the prior art. As shown in FIG. 1, the average charging current Iin is generated when a primary-side current Ip of a transformer 40 is filtered by an input capacitor Cin. When a power switch SW is turned on, the primary-side current Ip of the transformer 40 rises with a slope Vin/Lp. The power switch SW is turned off until the primary-side current Ip rises to Vref1/R42. Lp is the value of the primary-side inductance of the transformer 40. At this time, the energy stored in the primary-side inductance of the transformer 40 is transferred to the secondary-side inductance and charges an output capacitor Co through a Schottky diode Do.

The secondary-side current Is then decreases to zero with a slope Vout/Lsec, where Lsec is the value of the secondary-side inductance of the transformer 40. The drain voltage Vsw of the power switch SW decreases due to the resonance caused by the primary-side inductance of the transformer 40 and stray capacitors. When the drain voltage Vsw drops to the second reference voltage Vref2 (for example, the second reference voltage Vref2 is 1.2V), the power switch is turned on again. This process cycles until the charging of output capacitor Co completes.

Figure 2:
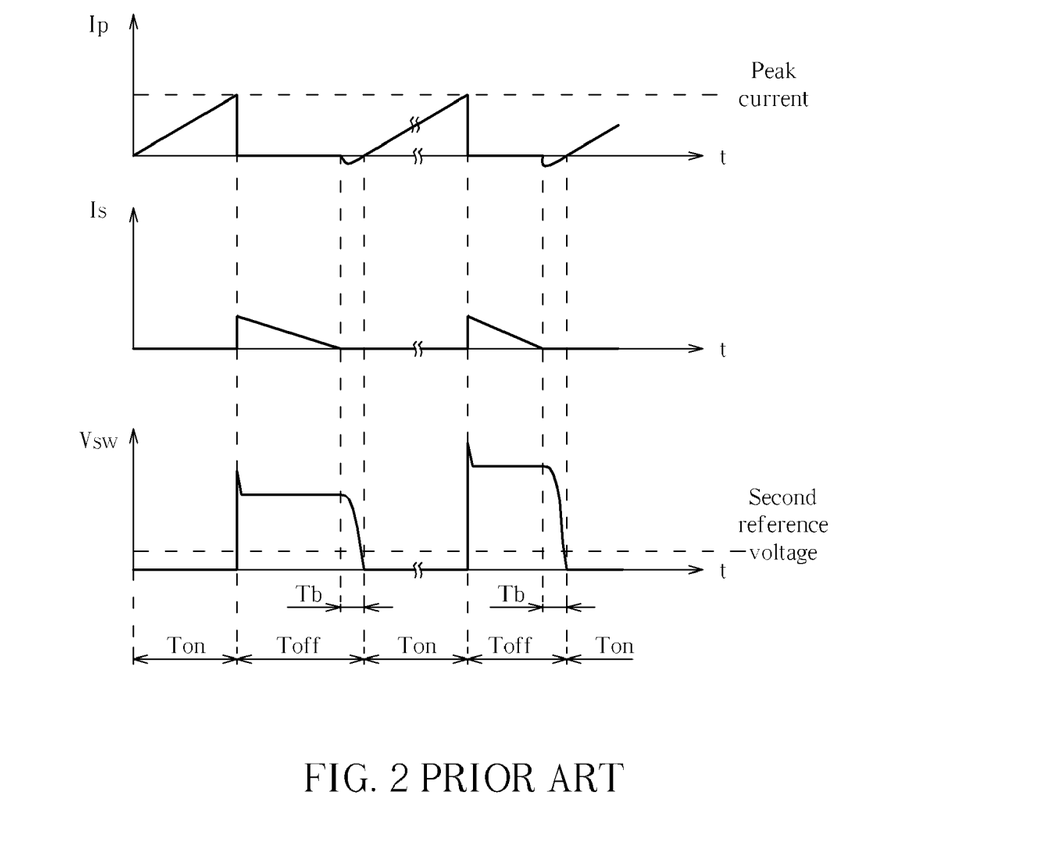
FIG. 2 is a timing sequence diagram of the waveforms of the primary-side current, the secondary-side current of the transformer, and the drain voltage of the power switch according to the prior art.

Please refer to FIG. 2. FIG. 2 is a timing sequence diagram of the waveforms of the primary-side current, the secondary-side current of the transformer, and the drain voltage of the power switch according to the prior art. As shown in FIG. 2, the secondary-side current Is of the transformer 40 gradually decreases to zero after the power switch SW is turned off. If the drain voltage Vsw of the power switch SW decreases to the second reference voltage Vref2 due to resonance, the power switch SW is turned on again. Therefore, a blank time Tb is generated, and the ratio of Tb to the turn-off time Toff of the power switch SW becomes larger with the increase of drain voltage Vsw (the drain voltage Vsw is approximately proportional to the output voltage Vout). Because the primary-side current Ip is negative during this period of the blank time, the average charging current Iin decreases with the increase of the output voltage Vout. Therefore, when the voltage of the output capacitor Co is close to its target value, the average charging current Iin becomes smaller, which causes the charging time of the output capacitor Co to lengthen.

For this reason, how to provide a PWM control circuit capable of adaptively adjusting the average charging current has already become one of the problems to be solved by researchers.

SUMMARY OF THE INVENTION

It is one of the objectives of the claimed invention to provide a pulse width modulation (PWM) control circuit to solve the abovementioned problems. Through detecting the voltage level of an output capacitor or variation on input voltage, a primary-side current of a transformer is adaptively adjusted to make average charging current maintain close to a constant state.

The present invention discloses a PWM control circuit applied to a power converter with a charging capacitor. The PWM control circuit includes a PWM signal generator, a first comparator, and a reference voltage modulator. The PWM signal generator is used for generating a PWM signal to control a power switch of the power converter. The first comparator has a first input terminal and a second input terminal. The first input terminal is used for receiving a first reference voltage and the second input terminal is used for receiving a sensing voltage, which is proportional to a primary-side current of a transformer in the power converter. When the power switch is turned on and the sensing voltage rises to the level of the first reference voltage, the first comparator outputs a first control signal to the PWM signal generator and then the PWM signal generator stops outputting the PWM signal and the power switch is turned off. The reference voltage modulator is used for outputting the first reference voltage according to a feedback voltage or an input voltage of the power converter, wherein the feedback voltage is relative to an output voltage of the power converter.

These and other objectives of the present invention will no doubt become obvious to those of ordinary skill in the art after reading the following detailed description of the preferred embodiment that is illustrated in the various figures and drawings.

DETAILED DESCRIPTION

Figure 3A:
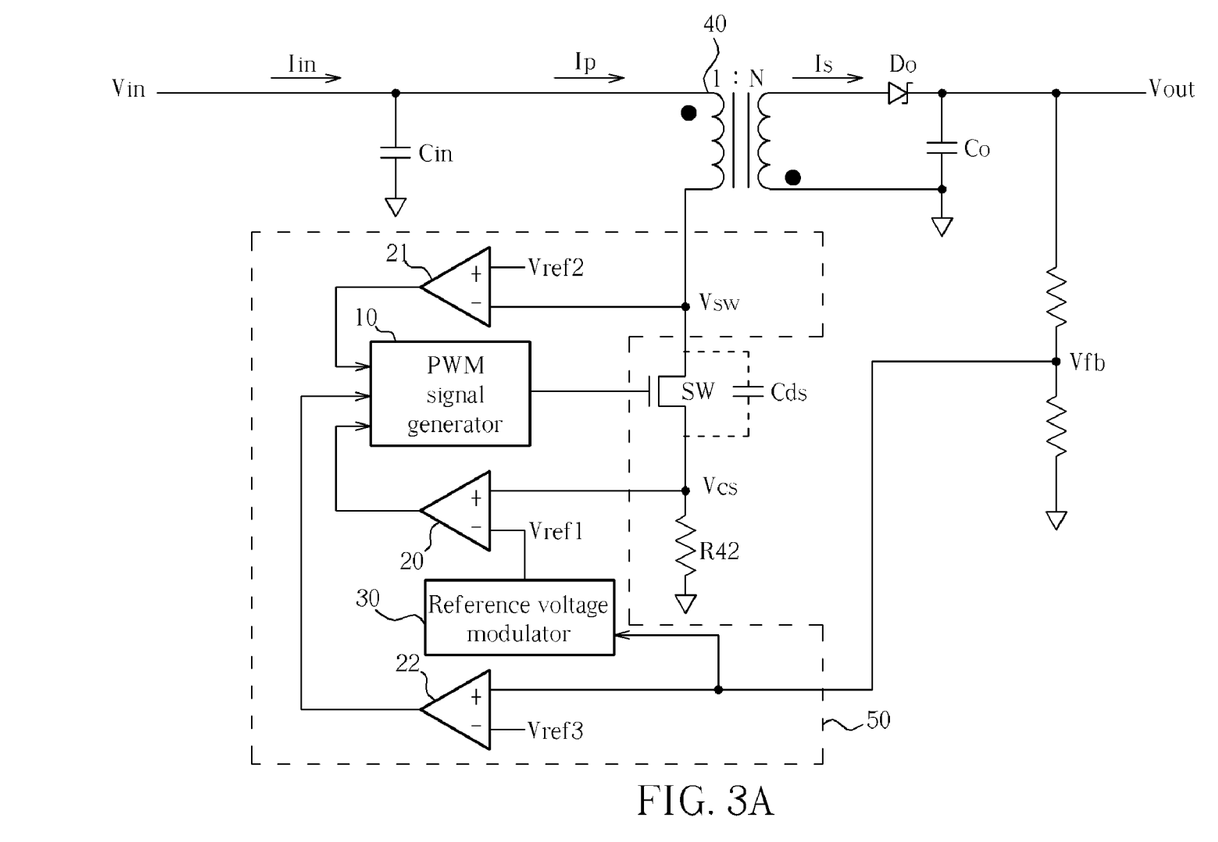
FIG. 3A is a diagram of a circuit according to a first embodiment of the present invention.

Please refer to FIG. 3A, which is a diagram of a circuit according to a first embodiment of the present invention. As shown in FIG. 3A, a pulse width modulation (PWM) control circuit 50 of the present invention includes a PWM signal generator 10, a first comparator 20, a second comparator 21, a third comparator 22, and a reference voltage modulator 30. The PWM control circuit 50 can be formed by, for example, an integrated circuit (IC). The PWM control circuit 50 can include a power switch SW and a resistor R42.

The PWM signal generator 10 generates a PWM signal according to the input control signal to control the power switch SW of the power converter. The power switch SW can be, for example, a metal oxide semiconductor (MOS) switch, and includes a parasitic capacitor Cds.

The first comparator 20 is electrically connected to the PWM signal generator 10 and has a first input terminal (i.e., the inverting input terminal) and a second input terminal (i.e., the non-inverting input terminal), wherein the first input terminal receives a first reference voltage Vref1 and the second input terminal receives a sensing voltage Vcs proportional to a primary-side current Ip of a transformer 40 in the power converter. When the power switch SW is turned on and the sensing voltage Vcs rises to the level of the first reference voltage Vref1, the first comparator 20 outputs a first control signal to the PWM signal generator 10 and then the PWM signal generator 10 outputs a signal to turn off the power switch SW.

The second comparator 21 has a first input terminal (i.e., the inverting input terminal) and a second input terminal (i.e., the non-inverting input terminal), wherein the first input terminal receives a drain voltage Vsw of the power switch SW and the second input terminal receives a second reference voltage Vref2. When the power switch SW is turned off and the drain voltage Vsw of the power switch SW decreases below the level of the second reference voltage Vref2, the second comparator 21 outputs a second control signal to the PWM signal generator 10 and then the PWM signal generator 10 outputs a signal to turn on the power switch SW.

The third comparator 22 has a first input terminal (i.e., the inverting input terminal) and a second input terminal (i.e., the non-inverting input terminal), wherein the first input terminal receives a third reference voltage Vref3 and the second input terminal receives a feedback voltage Vfb relative to an output voltage Vout. When the feedback voltage Vfb rises to the level of the third reference voltage Vref3, the third comparator 22 outputs a third control signal to the PWM signal generator 10 and then the PWM signal generator 10 stops outputting the PWM signal.

The reference voltage modulator 30 is electrically connected to the first comparator 20, which adjusts the voltage level of the first reference voltage Vref1 according to the feedback voltage Vfb relative to the output voltage Vout of the power converter. The feedback voltage Vfb is a divided voltage of the output voltage Vout.

In the following, circuit operations are illustrated. In order to prevent the average charging current Iin from varying with the output voltage Vout, the output voltage Vout must be detected to control the PWM signal generator 10 to maintain the average charging current Iin at a fixed value during the entire charging process.

When the power switch SW is turned off and the drain voltage Vsw is lower than the level of the second reference voltage Vref2, the second comparator 21 outputs the second control signal to the PWM signal generator 10 and then the PWM signal generator 10 outputs the signal to turn on the power switch SW.

When the power switch SW is turned on and the sensing voltage Vcs rises to the level of the first reference voltage Vref1, the first comparator 20 outputs the first control signal to the PWM signal generator 10 and then the PWM signal generator 10 outputs the signal to turn off the power switch SW.

Therefore, the reference voltage modulator 30 adaptively adjusts the voltage level of the first reference voltage Vref1 according to the voltage level of the output capacitor Co. Thus the PWM signal generator 10 controls the operations of the power switch SW, thereby maintaining the average charging current Iin at a fixed value during the entire charging process.

Figure 3B:
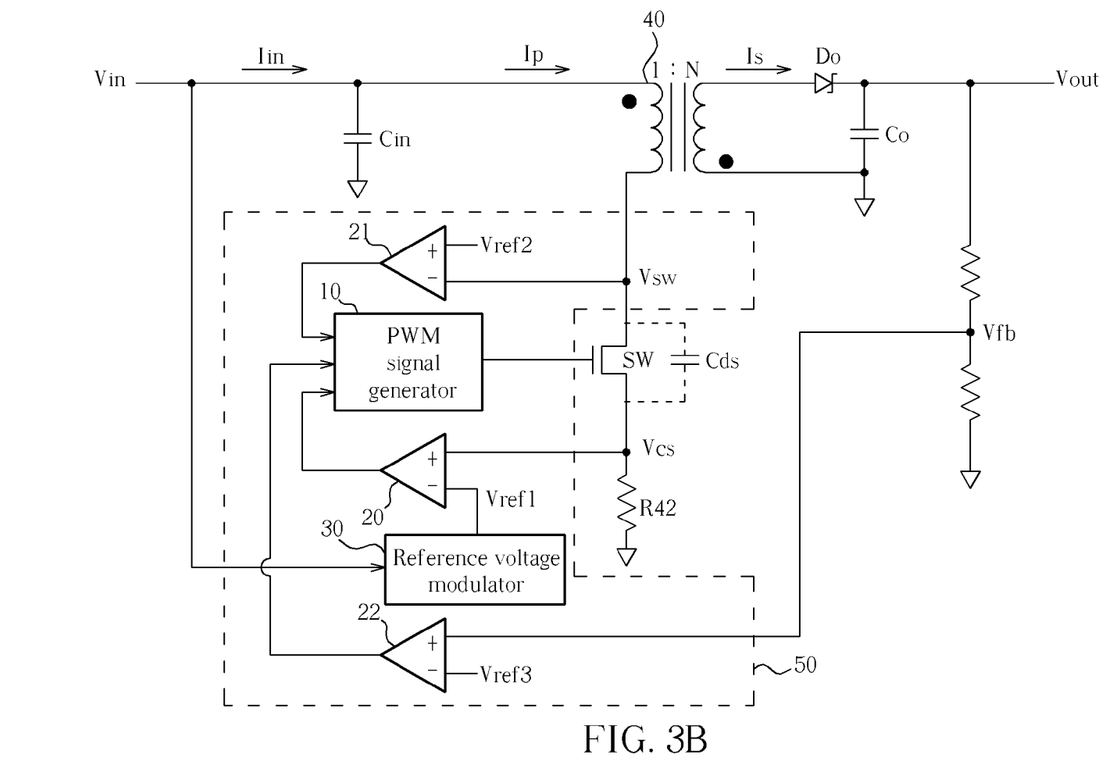
FIG. 3B is a diagram of a circuit according to a second embodiment of the present invention.

Please refer to FIG. 3B, which is a diagram of a circuit according to a second embodiment of the present invention. As shown in FIG. 3B, a PWM control circuit 50 of the present invention includes a PWM signal generator 10, a first comparator 20, a second comparator 21, a third comparator 22, and a reference voltage modulator 30. The PWM control circuit 50 can be formed by, for example, an integrated circuit (IC). The PWM control circuit 50 can include a power switch SW and a resistor R42.

The PWM signal generator 10 generates a PWM signal according to the input control signal to control the power switch SW of the power converter. The power switch SW can be, for example, a metal oxide semiconductor (MOS) switch, and includes a parasitic capacitor Cds.

The first comparator 20 is electrically connected to the PWM signal generator 10 and has a first input terminal (i.e., the inverting input terminal) and a second input terminal (i.e., the non-inverting input terminal), wherein the first input terminal receives the first reference voltage Vref1 and the second input terminal receives the sensing voltage Vcs proportional to the primary-side current Ip of the transformer 40 in the power converter. When the power switch SW is turned on and the sensing voltage Vcs rises to the level of the first reference voltage Vref1, the first comparator 20 outputs the first control signal to the PWM signal generator 10 and then the PWM signal generator 10 outputs a signal to turn off the power switch SW.

The second comparator 21 has a first input terminal (i.e., the inverting input terminal) and a second input terminal (i.e., the non-inverting input terminal), wherein the first input terminal receives the drain voltage Vsw of the power switch SW and the second input terminal receives a second reference voltage Vref2. When the power switch SW is turned off and the drain voltage Vsw of the power switch SW decreases below the level of the second reference voltage Vref2, the second comparator 21 outputs the second control signal to the PWM signal generator 10 and then the PWM signal generator 10 outputs a signal to turn on the power switch SW.

The third comparator 22 has a first input terminal (i.e., the inverting input terminal) and a second input terminal (i.e., the non-inverting input terminal), wherein the first input terminal receives a third reference voltage Vref3 and the second input terminal receives the feedback voltage Vfb relative to the output voltage Vout. When the feedback voltage Vfb rises to the level of the third reference voltage Vref3, the third comparator 22 outputs a third control signal to the PWM signal generator 10 and then the PWM signal generator 10 stops outputting the PWM signal to the power switch SW.

The reference voltage modulator 30 is electrically connected to the input voltage Vin of the power converter and to the first comparator 20, which adjusts the voltage level of the first reference voltage Vref1 according to the input voltage Vin of the power converter. The input voltage Vin can include, but is not limited to, a battery.

In the following, circuit operations are illustrated. For example, the input voltage Vin is from a battery. Because the charge of a battery will gradually decrease with an increasing usage time, the input voltage Vin decreases, too. In order to prevent the charging time from varying with the input voltage Vin, the input voltage Vin must be detected to control the PWM signal generator 10 to maintain the charging time at a fixed value during the charging process.

When the power switch SW is turned off and the drain voltage Vsw is lower than the level of the second reference voltage Vref2, the second comparator 21 outputs the second control signal to the PWM signal generator 10 and then the PWM signal generator 10 outputs the signal to turn on the power switch SW.

When the power switch SW is turned on and the sensing voltage Vcs rises to the level of the first reference voltage Vref1, the first comparator 20 outputs the first control signal to the PWM signal generator 10 and then the PWM signal generator 10 outputs the signal to turn off the power switch SW.

Therefore, the reference voltage modulator 30 can adaptively adjusts the voltage level of the first reference voltage Vref1 according to the voltage level of the input voltage Vin. Thus the PWM signal generator 10 controls the operations of the power switch SW, thereby maintaining the charging time at a fixed value during the charging process.

Figure 3C:
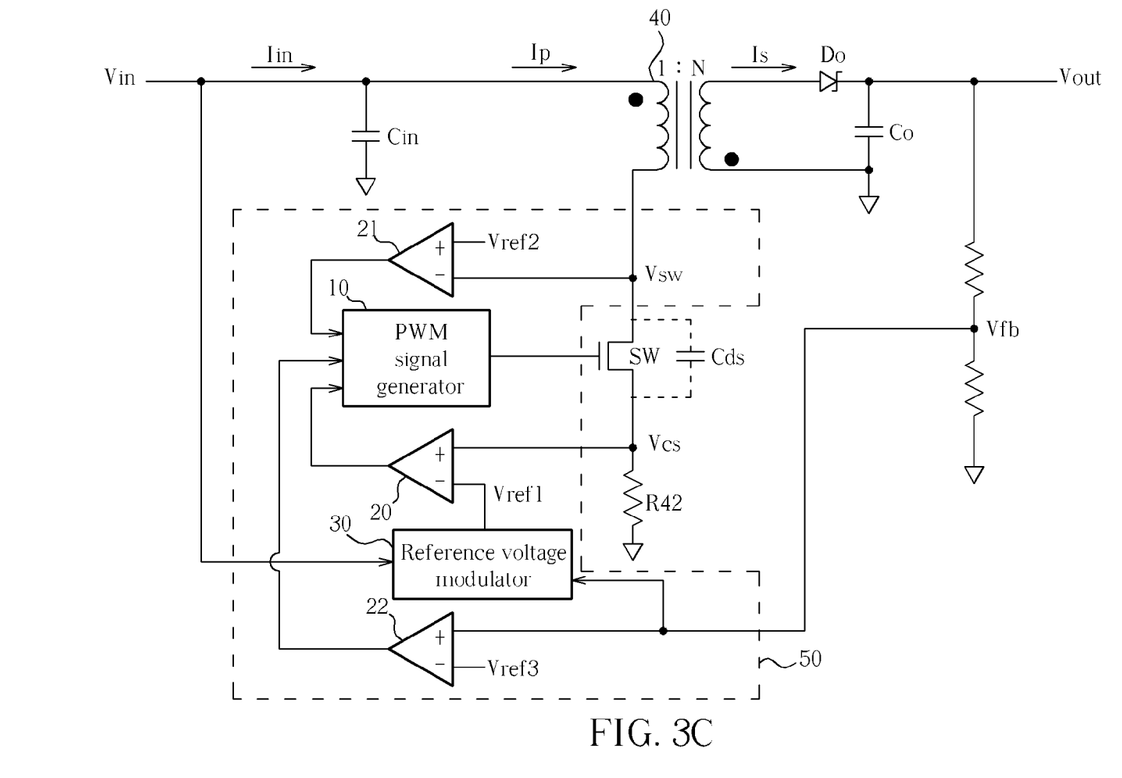
FIG. 3C is a diagram of a circuit according to a third embodiment of the present invention.

Please refer to FIG. 3C, which is a diagram of a circuit according to a third embodiment of the present invention. As shown in FIG. 3C, a PWM control circuit 50 of the present invention includes a PWM signal generator 10, a first comparator 20, a second comparator 21, a third comparator 22, and a reference voltage modulator 30. The PWM control circuit 50 can be formed by, for example, an integrated circuit (IC). The PWM control circuit 50 can include a power switch SW and a resistor R42.

The PWM signal generator 10 generates a PWM signal according to the input control signal and then outputs the PWM signal to the power switch SW to control the power switch SW of the power converter. The power switch SW can be, for example, a metal oxide semiconductor (MOS) switch, and includes a parasitic capacitor Cds.

The first comparator 20 is electrically connected to the PWM signal generator 10 and has a first input terminal (i.e., the inverting input terminal) and a second input terminal (i.e., the non-inverting input terminal), wherein the first input terminal receives the first reference voltage Vref1 and the second input terminal receives the sensing voltage Vcs proportional to the primary-side current Ip of the transformer 40 in the power converter. When the power switch SW is turned on and the sensing voltage Vcs rises to the level of the first reference voltage Vref1, the first comparator 20 outputs the first control signal with logic high level to the PWM signal generator 10 and then the PWM signal generator 10 outputs a signal to turn off the power switch SW.

The second comparator 21 has a first input terminal (i.e., the inverting input terminal) and a second input terminal (i.e., the non-inverting input terminal), wherein the first input terminal receives the drain voltage Vsw of the power switch SW and the second input terminal receives a second reference voltage Vref2. When the power switch SW is turned off and the drain voltage Vsw of the power switch SW decreases below the level of the second reference voltage Vref2, the second comparator 21 outputs the second control signal with logic high level to the PWM signal generator 10 and then the PWM signal generator 10 outputs the PWM signal to turn on the power switch SW.

The third comparator 22 has a first input terminal (i.e., the inverting input terminal) and a second input terminal (i.e., the non-inverting input terminal), wherein the first input terminal receives a third reference voltage Vref3 and the second input terminal receives the feedback voltage Vfb relative to the output voltage Vout. When the feedback voltage Vfb rises to the level of the third reference voltage Vref3, the third comparator 22 outputs the third control signal with logic high level to the PWM signal generator 10 and then the PWM signal generator 10 stops outputting the PWM signal to the power switch SW.

The reference voltage modulator 30 is electrically connected to the input voltage Vin of the power converter, to the first comparator 20, and to the feedback voltage Vfb, which adjusts the voltage level of the first reference voltage Vref1 according to the voltage level of the input voltage Vin of the power converter or the voltage level of the feedback voltage Vfb. The feedback voltage Vfb is a divided voltage of the output voltage Vout. The input voltage Vin can include, but is not limited to, a battery.

In the following, circuit operations are illustrated. In order to prevent the average charging current Iin from varying with the output voltage Vout or prevent the charging time from varying with the input voltage Vin, first, detecting the output voltage Vout to control the PWM signal generator 10, thereby making the average charging current Iin maintain at a fixed value during the whole charging process. Similarly, take the input voltage Vin is a battery power source as example. Because the battery voltage will gradually decrease with the increasing usage time, the input voltage Vin decreases, too. Therefore, the input voltage Vin must be detected to control the PWM signal generator 10 to maintain the charging time at a fixed value during the whole charging process.

When the power switch SW is turned off and the drain voltage Vsw is lower than the level of the second reference voltage Vref2, the second comparator 21 outputs the second control signal with logic high level to the PWM signal generator 10 and then the PWM signal generator 10 outputs the PWM signal to turn on the power switch SW.

When the power switch SW is turned on and the sensing voltage Vcs rises to the level of the first reference voltage Vref1, the first comparator 20 outputs the first control signal with logic high level to the PWM signal generator 10 and then the PWM signal generator 10 stops outputting the PWM signal and then the power switch SW is turned off.

Therefore, the reference voltage modulator 30 adaptively adjusts the voltage level of the first reference voltage Vref1 according to the voltage level of the input voltage Vin or the output voltage Vout. Thus the PWM signal generator 10 controls the operations of the power switch SW, thereby maintaining the average charging current Iin and the charging time at fixed values during the charging process.

Figure 4:
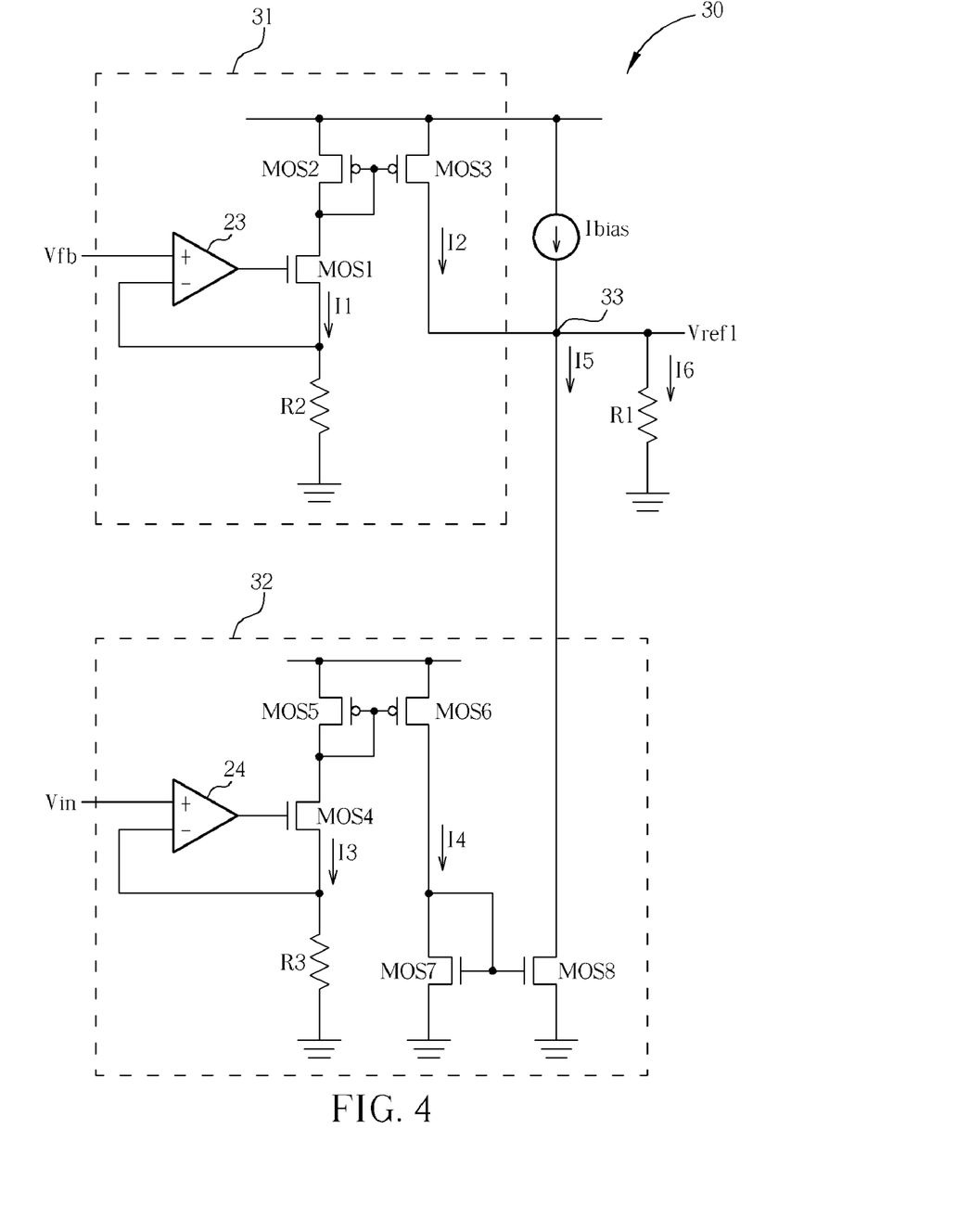
FIG. 4 is a detailed circuit diagram of the reference voltage modulator shown in the third embodiment of the present invention.

Please refer to FIG. 4, which is a detailed circuit diagram of the reference voltage modulator 30 shown in the third embodiment of the present invention. As shown in FIG. 4, the reference voltage modulator 30 of the present invention includes a first voltage-to-current converting circuit 31, a second voltage-to-current converting circuit 32, a current source Ibias, and a first resistor R1. The first voltage-to-current converting circuit 31 includes a fourth comparator 23, a second resistor R2, a first transistor MOS1, a second transistor MOS2, and a third transistor MOS3. The second voltage-to-current converting circuit 32 includes a fifth comparator 24, a third resistor R3, a fourth transistor MOS4, a fifth transistor MOS5, a sixth transistor MOS6, a seventh transistor MOS7, and a eighth transistor MOS8.

The fourth comparator 23 has a first input terminal (i.e., the inverting input terminal), a second input terminal (i.e., the non-inverting input terminal), and an output terminal, wherein the second input terminal receives the feedback voltage Vfb.

The first transistor MOS1 has a gate electrically connected to the output terminal of the fourth comparator 23, and a source electrically connected to the first input terminal of the fourth comparator 23. The first transistor MOS1 can be an N-type metal oxide semiconductor, but is not limited to this only.

The second resistor R2 has a first end electrically connected to the source of the first transistor MOS1, and a second end electrically connected to the grounding end.

The second transistor MOS2 has a drain and a gate electrically connected to the drain of the first transistor MOS1, a source electrically connected to the power source end. The second transistor MOS2 can be a P-type metal oxide semiconductor, but is not limited to this only.

The third transistor MOS3 has a gate electrically connected to the gate of the second transistor MOS2, a source electrically connected to the power source end, and a drain electrically connected to the node 33. The third transistor MOS3 can be a P-type metal oxide semiconductor, but is not limited to this only.

The fifth comparator 24 has a first input terminal (i.e., the inverting input terminal), a second input terminal (i.e., the non-inverting input terminal), and an output terminal, wherein the second input terminal receives the input voltage Vin.

The fourth transistor MOS4 has a gate electrically connected to the output terminal of the fifth comparator 24, and a source electrically connected to the first input terminal of the fifth comparator 24. The fourth transistor MOS4 can be an N-type metal oxide semiconductor, but is not limited to this only.

The third resistor R3 has a first end electrically connected to the source of the fourth transistor MOS4, and a second end electrically connected to the grounding end.

The fifth transistor MOS5 has a drain and a gate electrically connected to the drain of the fourth transistor MOS4, and a source electrically connected to the power source end. The fifth transistor MOS5 can be a P-type metal oxide semiconductor, but is not limited to this only.

The sixth transistor MOS6 has a gate electrically connected to the gate of the fifth transistor MOS5, and a source electrically connected to the power source end. The sixth transistor MOS6 can be a P-type metal oxide semiconductor, but is not limited to this only.

The seventh transistor MOS7 has a drain and a gate electrically connected to the drain of the sixth transistor MOS6, a source electrically connected to the grounding end. The seventh transistor MOS7 can be an N-type metal oxide semiconductor, but is not limited to this only.

The eighth transistor MOS8 has a gate electrically connected to the gate of the seventh transistor MOS7, a source electrically connected to the grounding end, and a drain electrically connected to the node 33. The eighth transistor MOS8 can be an N-type metal oxide semiconductor, but is not limited to this only.

In the following, circuit operations are illustrated. The second transistor MOS2 and the third transistor MOS3 constitute a first current mirror circuit. The fifth transistor MOS5 and the sixth transistor MOS6 constitute a second current mirror circuit. The seventh transistor MOS7 and the eighth transistor MOS8 constitute a third mirror circuit. The first voltage-to-current converting circuit 31 receives the feedback voltage Vfb for converting the feedback voltage Vfb into a first current I1. The first current mirror circuit generates the second current I2 the same as the first current I1, wherein the current value of the first current I1 equals Vfb/R2.

The second voltage-to-current converting circuit 32 receives the input voltage Vin for converting the input voltage Vin into a second current I3. The second current mirror circuit generates the fourth current I4 the same as the third current I3, and the third current mirror circuit generates the fifth current I5 the same as the fourth current I4, wherein the current value of the third current I3 generated by the second current mirror circuit equals Vin/R3.

Because the sixth current I6=Ibias+I2-I5 and the first reference voltage Vref1=I6×R1, the first reference voltage Vref1 increases with the increase of the feedback voltage Vfb and increases with the decrease of the input voltage Vin. Therefore, by adjusting the values of the first resistor R1, the second resistor R2, the third resistor R3, and the current source Ibias, a suitable first reference voltage Vref1 is obtained to prevent the average charging current Iin and the charging time from varying with the output voltage Vout or the input voltage Vin during the charging process. A better charging efficiency is thereby obtained.

In summary, the PWM control circuit of the present invention can adaptively adjust the primary-side current of the transformer through detecting the voltage level of the output capacitor. Therefore, the average charging current can be maintained close to a constant state, thereby speeding up the charging speed of the capacitor. Furthermore, through detecting the variation of the input voltage, the average charging current can be adjusted correspondingly, which achieves the goal of maintaining a fixed charging time.

Those skilled in the art will readily observe that numerous modifications and alterations of the device and method may be made while retaining the teachings of the invention.

What is claimed is:

1. A pulse width modulation (PWM) control circuit, applied to a power converter with a charging capacitor, the PWM control circuit comprising:
   a PWM signal generator, for generating a PWM signal to control a power switch of the power converter;
   a first comparator, having a first input terminal and a second input terminal, the first input terminal used for receiving a first reference voltage and the second input terminal used for receiving a sensing voltage, which is proportional to a primary-side current of a transformer in the power converter, wherein when the power switch is turned on and the sensing voltage rises to the level of the first reference voltage, the first comparator outputs a first control signal to the PWM signal generator and then the PWM signal generator stops outputting the PWM signal and the power switch is turned off; and
   a reference voltage modulator, for outputting the first reference voltage according to a feedback voltage relative to an output voltage of the power converter, wherein the reference voltage modulator comprises:
      a voltage-to-current converting circuit, for converting the feedback voltage into a first current, the voltage-to-current converting circuit comprising a current mirror circuit for generating a second current to be the same as the first current;
      a current source, electrically connected to the current mirror circuit; and
      a first resistor, wherein a third current flows through the first resistor to generate the first reference voltage;
      wherein the current mirror circuit, the current source, and the first resistor are electrically connected to the first input terminal of the first comparator, and a sum of the second current and a current of the current source equals the third current.

2. The PWM control circuit of claim 1, wherein the PWM control circuit further comprises:
   a second comparator, having a first input terminal and a second input terminal, the first input terminal receiving a drain voltage of the power switch and the second input terminal receiving a second reference voltage, and when the power switch is turned off and the drain voltage decreases below the level of the second reference voltage, the second comparator outputs a second control signal to the PWM signal generator and the PWM signal generator outputs the PWM signal to turn on the power switch.

3. The PWM control circuit of claim 1, wherein the PWM control circuit further comprises:
   a third comparator, having a first input terminal and a second input terminal, the first input terminal receiving a third reference voltage and the second input terminal receiving the feedback voltage, and when the feedback voltage rises to the level of the third reference voltage, the third comparator outputs a third control signal to the PWM signal generator to stop the PWM signal generator from outputting the PWM signal.

4. A PWM control circuit, applied to a power converter with a charging capacitor, the PWM control circuit comprising:
   a PWM signal generator, for generating a PWM signal to control a power switch of the power converter;
   a first comparator, having a first input terminal and a second input terminal, the first input terminal receiving a first reference voltage and the second input terminal receiving a sensing voltage, which is proportional to a primary-side current of a transformer in the power converter, wherein when the power switch is turned on and the sensing voltage rises to the level of the first reference voltage, the first comparator outputs a first control signal to the PWM signal generator and the PWM signal generator stops outputting the PWM signal and the power switch is turned off; and
   a reference voltage modulator, for outputting the first reference voltage according to an input voltage of the power converter, wherein the reference voltage modulator comprises:
      a voltage-to-current converting circuit, for converting the input voltage into a first current, the voltage-to-current converting circuit comprising:
         a first current mirror circuit, for generating a second current to be the same as the first current; and
         a second current mirror circuit, for generating a third current to be the same as the second current;
      a current source, electrically connected to the second current mirror circuit; and
      a first resistor, wherein a fourth current flows through the first resistor to generate the first reference voltage;
   wherein the second current mirror circuit, the current source, and the first resistor are electrically connected to the first input terminal of the first comparator, and a sum of the third current and the fourth current equals a current of the current source.

5. The PWM control circuit of claim 4, wherein the PWM control circuit further comprises:
   a second comparator, having a first input terminal and a second input terminal, the first input terminal receiving a drain voltage of the power switch and the second input terminal receiving a second reference voltage, and when the power switch is turned off and the drain voltage decreases below the level of the second reference voltage, the second comparator outputs a second control signal to the PWM signal generator and then the PWM signal generator outputs the PWM signal to turn on the power switch.

6. The PWM control circuit of claim 4, wherein the PWM control circuit further comprises:
   a third comparator, having a first input terminal and a second input terminal, the first input terminal receiving a third reference voltage and the second input terminal receiving a feedback voltage relative to an output voltage of the power converter, and when the feedback voltage rises to the level of the third reference voltage, the third comparator outputs a third control signal to the PWM signal generator to stop the PWM signal generator from outputting the PWM signal.

7. A PWM control circuit, applied to a power converter with a charging capacitor, the PWM control circuit comprising:
   a PWM signal generator, for generating a PWM signal to control a power switch of the power converter;
   a first comparator, having a first input terminal and a second input terminal, the first input terminal receiving a first reference voltage and the second input terminal receiving a sensing voltage, which is proportional to a primary-side current of a transformer in the power converter, wherein when the power switch is turned on and the sensing voltage rises to the level of the first reference voltage, the first comparator outputs a first control signal to the PWM signal generator and the PWM signal generator stops outputting the PWM signal and the power switch is turned off; and
   a reference voltage modulator, for outputting the first reference voltage according to a feedback voltage and an input voltage of the power converter, wherein the feedback voltage is relative to an output voltage of the power converter, wherein the reference voltage modulator comprises:
      a first voltage-to-current converting circuit, for converting the feedback voltage into a first current, the first voltage-to-current converting circuit comprising a first current mirror circuit for generating a second current to be the same as the first current;
      a second voltage-to-current converting circuit, for converting the input voltage into a third current, the second voltage-to-current converting circuit comprising:
         a second current mirror circuit, for generating a fourth current to be the same as the third current; and
         a third current mirror circuit, for generating a fifth current to be the same as the fourth current;
      a current source, electrically connected to the first current mirror circuit and the third current mirror circuit; and
      a first resistor, wherein a sixth current flows through the first resistor to generate the first reference voltage;
   wherein the first current mirror circuit, the third current mirror circuit, the current source, and the first resistor are electrically connected to the first input terminal of the first comparator, and a sum of the second current and a current of the current source equals a sum of the sixth current and the fifth current.

8. The PWM control circuit of claim 7, wherein the PWM control circuit further comprises:
   a second comparator, having a first input terminal and a second input terminal, the first input terminal receiving a drain voltage of the power switch and the second input terminal receiving a second reference voltage, and when the power switch is turned off and the drain voltage decreases below the level of the second reference voltage, the second comparator outputs a second control signal to the PWM signal generator and the PWM signal generator outputs the PWM signal to turn on the power switch.

9. The PWM control circuit of claim 7, wherein the PWM control circuit further comprises:
a third comparator, having a first input terminal and a second input terminal, the first input terminal receiving a third reference voltage and the second input terminal receiving a feedback voltage relative to the output voltage, and when the feedback voltage rises to the level of the third reference voltage, the third comparator outputs a third control signal to the PWM signal generator to stop the PWM signal generator from outputting the PWM signal.

* * * * *